(12) United States Patent
Drottar et al.

(10) Patent No.: US 6,446,235 B1
(45) Date of Patent: Sep. 3, 2002

(54) CUMULATIVE ERROR DETECTING CODE

(75) Inventors: Ken Drottar; David S. Dunning, both of Portland; Richard S. Jensen, Aloha; Joseph E. Pelissier, Hillsboro, all of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/386,474

(22) Filed: Aug. 31, 1999

(51) Int. Cl.[7] .................. G06F 11/10; H03M 13/00
(52) U.S. Cl. .................. 714/781; 714/758; 370/473
(58) Field of Search .................. 714/758, 807, 714/818, 781, 746, 747; 370/473

(56) References Cited

U.S. PATENT DOCUMENTS

| | | | |
|---|---|---|---|
| 5,608,738 A | * | 3/1997 | Matsushita |
| 5,774,469 A | * | 6/1998 | Wirkestrand |
| 6,084,888 A | * | 7/2000 | Watanabe et al. |
| 6,157,642 A | * | 12/2000 | Sturza et al. |

OTHER PUBLICATIONS

W. Stallings, "Data and Computer Communications", *Prentice Hall*, 5th Edition, 1997, pp. 164–171.

* cited by examiner

*Primary Examiner*—Phung M. Chung
(74) *Attorney, Agent, or Firm*—Antonelli, Terry, Stout & Kraus, LLP

(57) ABSTRACT

An error detection technique uses a cumulative error detecting code (such as a cumulative CRC checksum or the like). At the source node (transmitter side) an error detecting code of a previous cell is stored. The next cell to be transmitted is received and the error detecting code of the previous cell is appended to the next cell. A next error detecting code is calculated as a function of at least a portion of the next cell to be transmitted and the previous error detecting code appended thereto. The previous error detecting code appended to the next cell is replaced with the next error detecting code, and the next cell including the next error detecting code appended thereto is transmitted. In this manner, the cumulative error detecting code is calculated over the current cell and a previous error detecting code. Thus, the cumulative error detecting code can be used to detect bit errors in each individual cell as well as to detect one or more missing or dropped cells.

16 Claims, 5 Drawing Sheets

CELL HEADER 302

CUMULATIVE ERROR DETECTING CODE

FIELD

The invention generally relates to computers and computer networks and in particular to a cumulative error detecting code.

BACKGROUND

In computer networks or data networks, data cells are transmitted from a source to a destination over a fabric or network. The fabric or network may include a collection of switches that are interconnected via communication links. Regardless of the design of the network, there will usually be errors during transmission over the fabric or network, resulting in the change or corruption of one or more bits in a transmitted cell.

Error detection techniques are frequently used to detect some types of errors. For a given frame of bits or cell, additional bits that constitute an error detecting code are added to the cell or frame at the source before the cell is transmitted. The error detecting code is calculated as a function of the other transmitted bits. The destination device performs the same calculation on the received bits and compares the calculated code with the received error detecting code. A detected error occurs if and only if there is a mismatch.

One of the most common and one of the most powerful error detecting codes is the cyclic redundancy check (CRC), which can be described as follows. Given a k-bit block of bits, or message, the transmitter (or source) generates an n-bit sequence, known as a checksum (or frame check sequence) so that the resulting frame, consisting of k+n bits, is exactly divisible by some predetermined number. The resulting frame (or cell), including the k-bit message with the n-bit checksum appended thereto, is then transmitted to a destination. At the destination, the received resulting frame (k+n bits) is divided by the same predetermined number. If there is no remainder, then the receiver at the destination assumes there was no error.

While error detecting codes such as CRC can be used to detect some types of transmission errors, there may be several types of errors which are undetectable by a standard error detecting code or CRC. Therefore, there is a need for an improved error detection technique.

SUMMARY

According to an embodiment of the present invention, a method of transmitting cells is provided. An error detecting code of a previous cell is stored. The next cell to be transmitted is received. The error detecting code of the previous cell is appended to the next cell, and a next error detecting code is calculated as a function of at least a portion of the next cell to be transmitted and the error detecting code of the previous cell appended thereto. The error detecting code of the previous cell appended to the next cell is replaced with the next error detecting code. The next cell including the next error detecting code appended thereto is then transmitted.

According to another embodiment of the present invention, a method of receiving a cell is provided. A previous error detecting code is stored. A next cell is received including a next error detecting code appended thereto. The next error detecting code is stored. The next error detecting code appended to the next cell is replaced with the previous error detecting code. A test error detecting code is calculated as a function of the next cell and the previous error detecting code appended thereto. The test error detecting code is compared with the next error detecting code to determine if there is an error in the received next cell.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and is not limited thereto. The spirit and scope of the present invention being limited only by the terms of the appended claims.

The following represents brief descriptions of the drawings, wherein.

DETAILED DESCRIPTION

According to an embodiment of the present invention, an error detection technique is provided that uses a cumulative error detecting code (such as a cumulative CRC checksum or the like). At the source node (transmitter side) an error detecting code of a previous cell is stored. The next cell to be transmitted is received and the error detecting code of the previous cell is appended to the next cell. A next error detecting code is calculated as a function of at least a portion of the next cell to be transmitted and the error detecting code of the previous cell appended thereto. In this manner, the cumulative error detecting code can be used to detect bit errors in each individual cell as well as missing or dropped packets.

Figure 1:
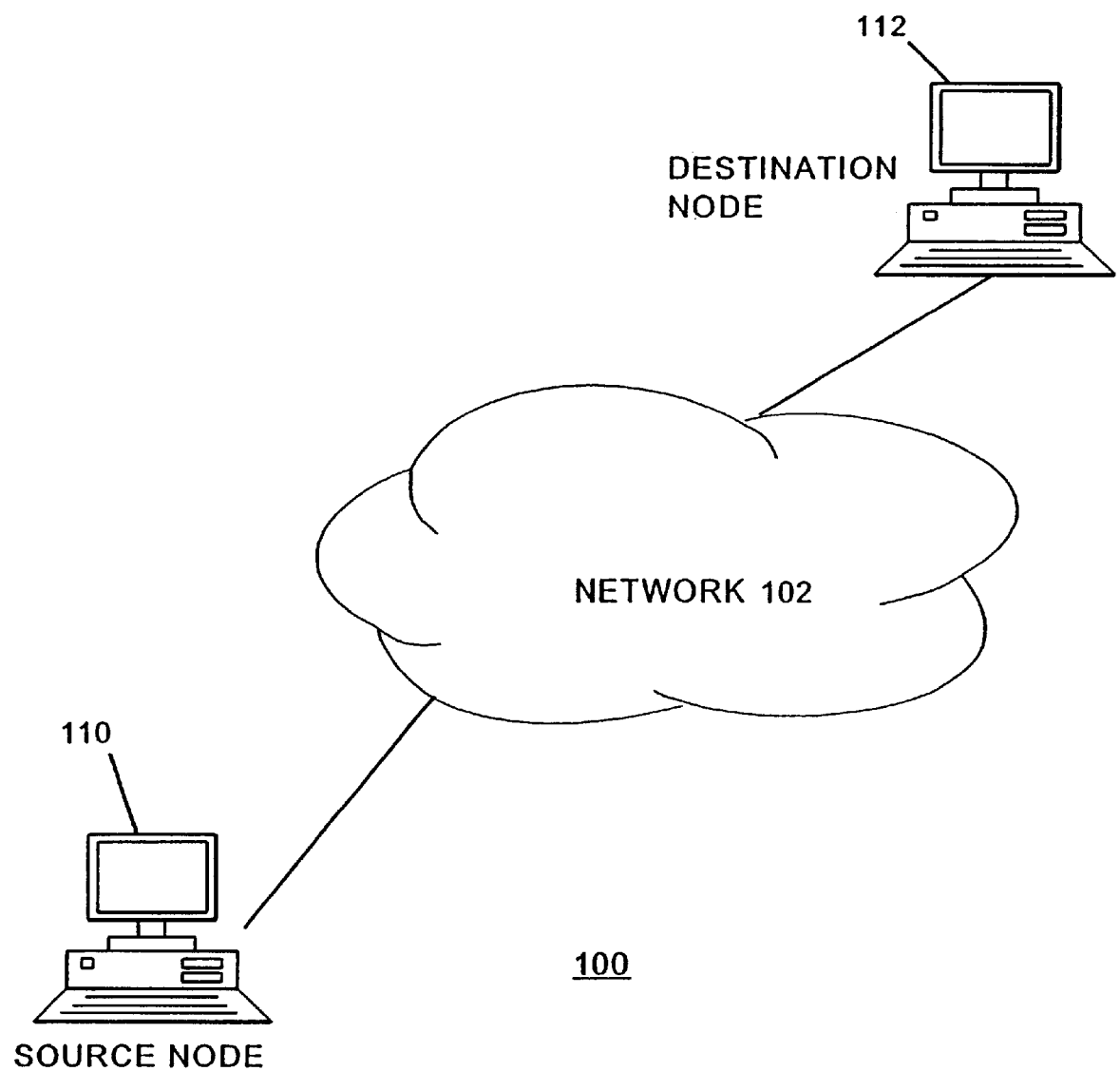
FIG. 1 is a block diagram illustrating an example system according to an embodiment of the present invention.

Referring to the figures in which like numerals indicate like elements, FIG. 1 is a block diagram illustrating an example system according to an embodiment of the present invention. As shown in FIG. 1, system 100 includes a plurality of nodes, including a source node 110, and a destination node 112. Source node 110 and destination node 112 each may be a computer, a server, a workstation, an input/output device and associated control logic, or other device. Nodes 110 and 112 are coupled together over a network 102 (or fabric), which includes a collection of switches that are interconnected via communication links. The switches may be any type of switching device, such as a switch, a router, a bridge, etc. Network 102 may be any type of network, including a Local Area Network (LAN), a Wide Area Network (WAN), a Storage Area Network (SAN)

or System Area Network (SAN), the INTERNET, or other network. The nodes 110 and 112 and the network 102 illustrated in FIG. 1 are only provided as an example system. The invention is not limited to this particular arrangement or configuration. Other network arrangements and configurations can be used as well.

Figure 2:
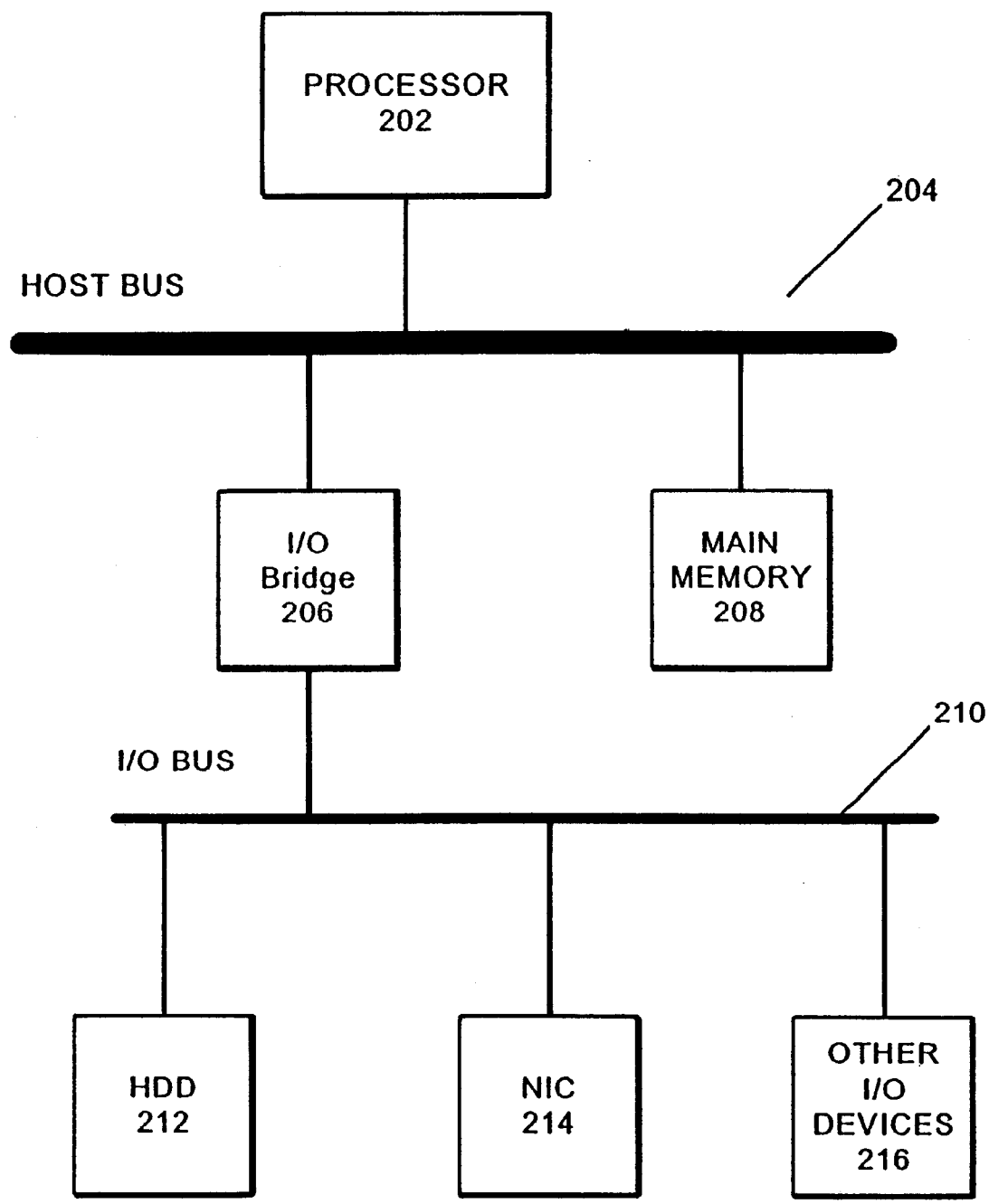
FIG. 2 is a block diagram illustrating an example node according to an embodiment of the present invention.

FIG. 2 is a block diagram illustrating an example node according to an embodiment of the present invention. The diagram of FIG. 2 illustrates the hardware and components which may be present in one or more of the nodes of FIG. 1, including source node 110 and destination node 112. As shown in FIG. 2, each node may include a processor 202 which is connected to a host bus 204. Main memory 208, which may include Dynamic Random Access Memory (DRAM) or other type of memory, is also connected to host bus 204. An I/O bridge 206 interfaces signals and transactions between the host bus 204 and I/O bus 210. A variety of input/output (I/O) devices may be connected to I/O bus 210, including a magnetic hard disk drive (HDD) 212, a network interface card (NIC) 214 and other I/O devices 216. The node is typically interfaced to network 102 (FIG. 1) via NIC 214.

Figure 3:
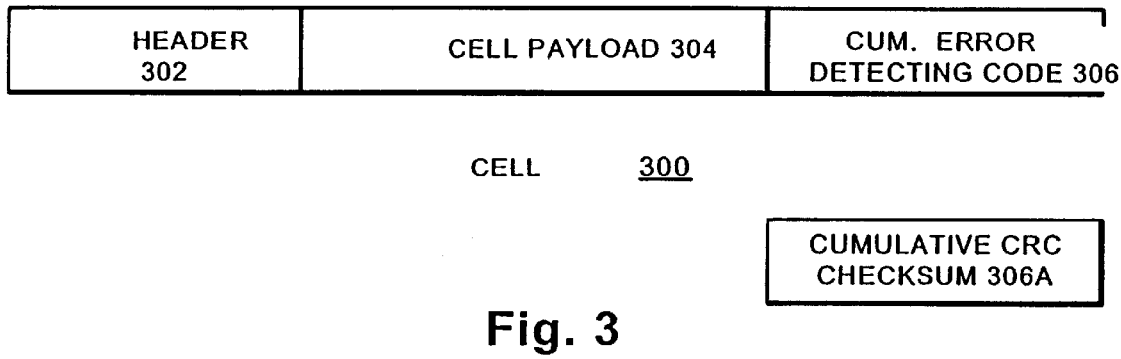
FIG. 3 is a diagram illustrating an example cell format according to an embodiment of the present invention.

According to an embodiment of the present invention, an improved mechanism for error detection is provided. FIG. 3 is a diagram illustrating an example cell format according to an embodiment of the present invention. Referring to FIG. 3, cell 300 includes a header 302, a cell payload (which may include data and other fields) and a cumulative error detecting code 306. According to an embodiment of the invention, cumulative error detecting code 306 may be, for example, a cumulative CRC checksum 306A as shown in FIG. 3. However, the present invention is not limited to the CRC error detection technique. Rather, the present invention can be applied to a variety of error detecting codes.

Figure 4:
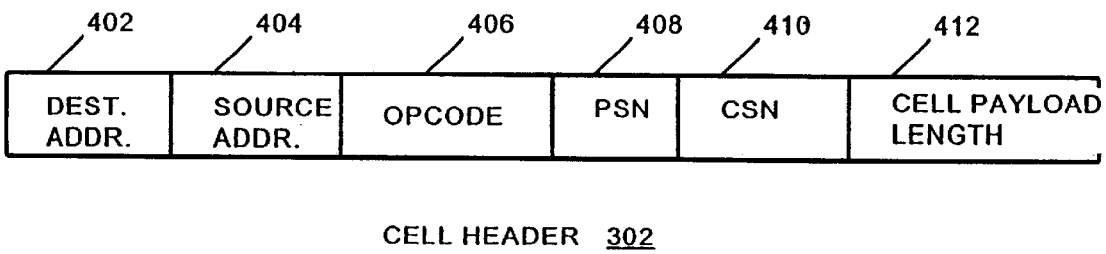
FIG. 4 is a diagram illustrating an example cell header format of the cell of FIG. 3 according to an embodiment of the present invention.

FIG. 4 is a diagram illustrating an example cell header format of the cell of FIG. 3 according to an example embodiment of the present invention. As shown in FIG. 4, cell header 302 may include several fields, such as a destination address 402 which identifies the destination of the cell, a source address 404 which identifies the source (e.g., address of source node 110), an opcode (or operation code) which may identify an operation to be performed at the destination node (such as read, write, etc.) and a cell payload length 412 which identifies the length (e.g., number of bytes)of the cell payload 304. Other than the destination address and probably the source address, the other fields in cell header 302 may be optional.

Although not required, cell header 302 may also include two additional fields, including a packet sequence number (PSN) 408 and a cell sequence number (CSN) 410. According to an embodiment of the invention, a message to be sent may be provided as one or more packets. The PSN 408 may be zero (0) for the first packet, and is incremented by one for each successive packet, and is provided for keeping track of the packets (to ensure each packet is received, and to identify the original order of the packets, etc.).

For packets containing a data payload greater than a predetermined size, it may be necessary to segment the packet data payload into two or more smaller cells at the source node for transmission over the network. At the destination node 112, the packet is reassembled using the data or payloads in each of the cells. A cell sequence number (CSN) 410 may also be provided in each cell to keep track of the individual cells corresponding to a particular packet. The cell sequence number (CSN) 410 may be initialized to zero for the first cell, and then incremented by one for each successive cell of a packet. The cell sequence number (CSN) 410 for each cell allows the destination node 112 to place the cells back in original order and to detect a missing cell.

The use of cell sequence numbers (CSNs) cannot be used to detect all instances of a dropped or lost cell. For example, the cell sequence number (CSN) 410 is a finite field (e.g., 8-bits) and may roll over if the number of cells in the packet exceeds the length of the CSN field. In some instances, a missing cell may be undetected at the destination node if the cell sequence number counter (CSN 410) rolls over and the network 102 drops a group of packets whose number exactly matches the length of the CSN field 410. These lost cells are typically undetectable by the CSN check at the destination node 112. There may be other instances where a group of dropped cells is undetectable at the receiver or destination node.

A standard CRC checksum (i.e., calculated over an individual cell only) can be appended as a tail to each cell to assist the destination node in determining whether the individual cell has been corrupted, but this would not allow the detection of a group of missing or dropped cells as described above. Therefore, according to an embodiment of the invention, a cumulative error detecting code is appended as a tail to each cell. The cumulative error detecting code of the present invention allows detection of a corrupted individual cell as well as detection of a group of dropped or missing cells as well.

Operation of the Cumulative Error Detecting Code

Figure 5:
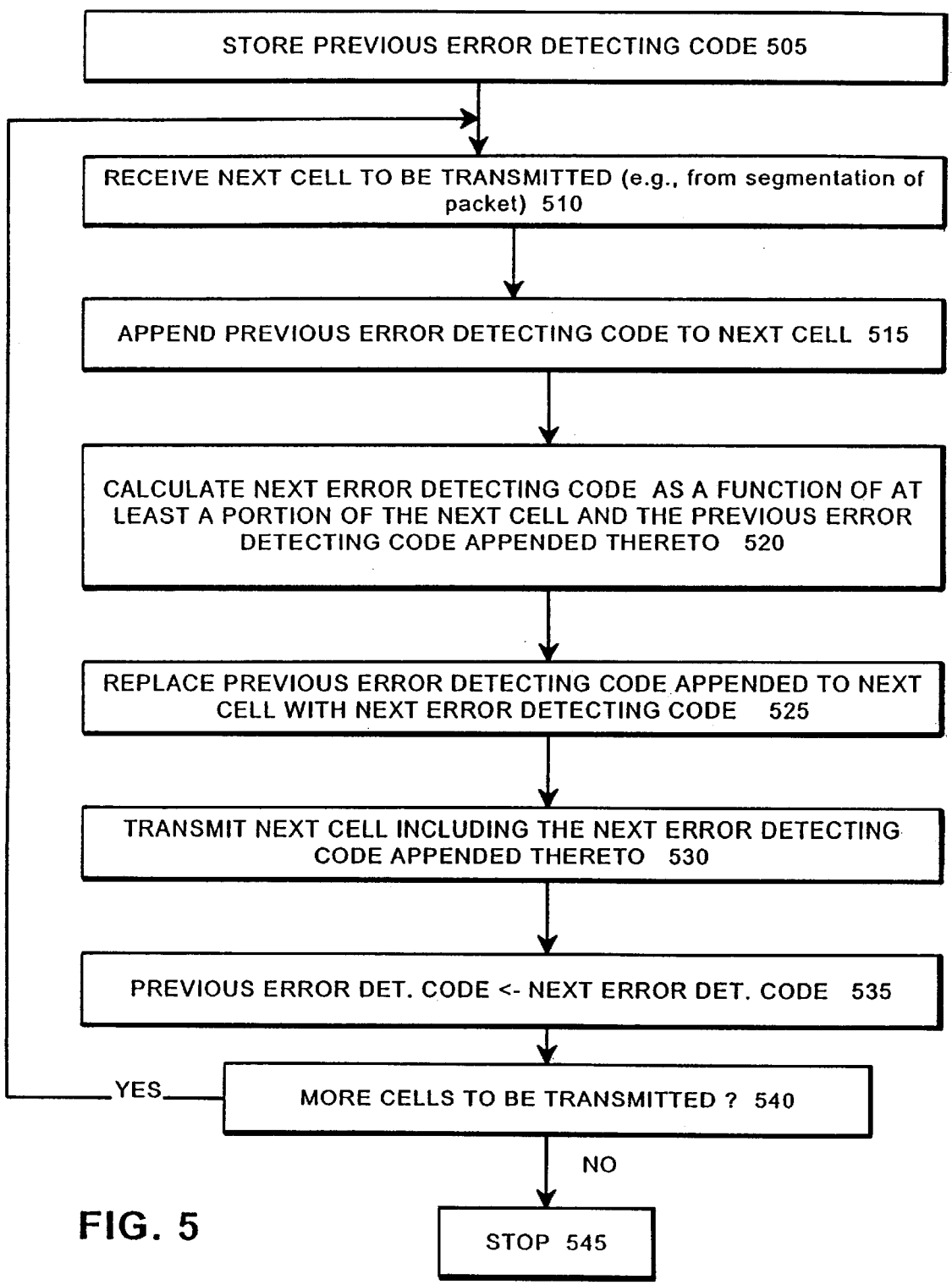
FIG. 5 is a flow chart illustrating operation of the cumulative error detecting code at the source node according to an example embodiment of the present invention.

The operation of a cumulative error detecting code will now be briefly described according to an embodiment of the invention. FIG. 5 is a flow chart illustrating operation of the cumulative error detecting code at the source node according to an example embodiment of the invention. First, the source node calculates an error detecting code over at least a portion of the first cell of the packet. For example, the source node 110 may calculate a CRC checksum 306A as a function of the header 302 and cell payload 304 of the first cell, and append the CRC checksum to the cell for transmission as shown in FIG. 3. The first cell with the appended error detecting code (e.g., CRC checksum) is transmitted to the destination node. This first error detecting code is stored at the source node as the previous error detecting code, block 505.

Next, at block 510, the next cell (e.g., second cell) to be transmitted is received (e.g., from the segmentation of the packet into a plurality of smaller cells), and may include header 302 and cell payload 304. The previous error detecting code is then appended to this next cell, block 515. A next error detecting code (e.g., a CRC checksum) is calculated as a function of at least a portion of the next cell (e.g., cell header and payload) and the previous error detecting code appended thereto, block 520. The previous error detecting code appended to the next cell is replaced with the next error detecting code (that was calculated in block 520), block 525. The source node then transmits the next cell with the next error detecting code (e.g., with the next CRC checksum) appended thereto, block 530. This next error detecting code is then stored at the source node as the "previous error detecting code," block 535. Thus, it can be seen that the next error detecting code is a cumulative error detecting code because it is calculated as a function of the next cell and the previous error detecting code. The cell sequence number field (CSN) 410, which may be provided in the cell header 302, is incremented for each cell.

At block 540, the source node determines if there are more cells in the packet to be transmitted. If there are no more cells to be transmitted, the process stops (for this packet, but can start again at block 505 for first cell of a new packet). If there are more cells in this packet to be transmitted, the process continues back to block 510.

For example, the next cell (e.g., the third cell) is received, block 510. The previous error detecting code (stored locally at source node at block 535) is appended to this next cell, block 515 and the next error detecting code is calculated as a function over the next cell and the appended previous error detecting code, 520. Thus, it can be seen that the error detecting code for the third cell is calculated as a function of the third cell (e.g., cell header and payload) as well as the error detecting code for the second cell. The previous error detecting code appended to the next cell is replaced with the next error detecting code (for the third cell), block 525. The next cell (e.g., the third cell) with this newly calculated error detecting code appended thereto is then transmitted, block 530. This next error detecting code is stored locally at the source node as the "previous error detecting code." The process then repeats if there are any further cells in the packet to be transmitted.

Figure 6:
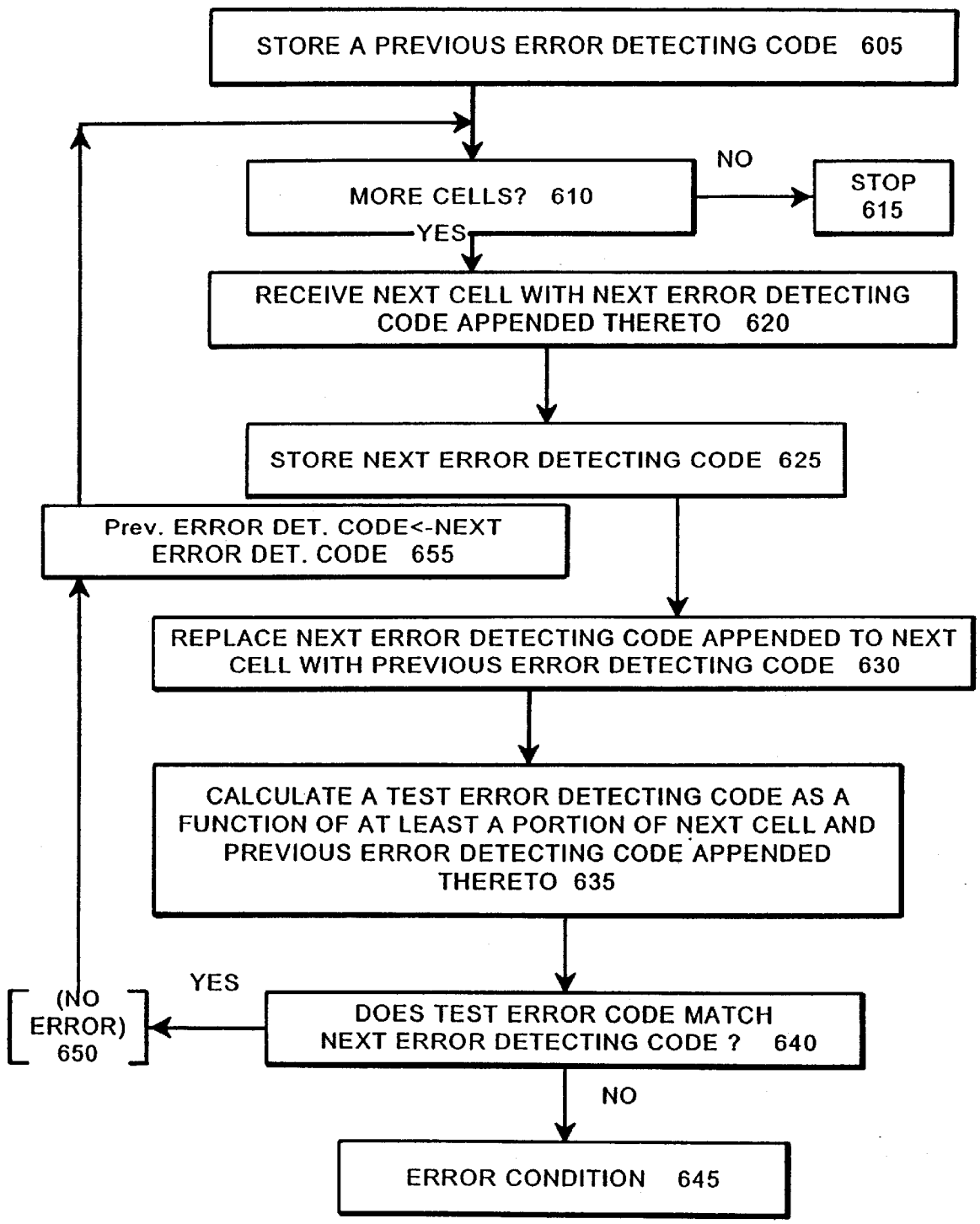
FIG. 6 is a flow chart illustrating operation of the cumulative error detecting code at the destination node according to an example embodiment of the invention.

FIG. 6 is a flow chart illustrating operation of the cumulative error detecting code at the destination node according to an example embodiment of the invention. The first cell of a packet is received and the error detecting code is calculated in a standard manner (e.g., over the cell payload and header) and compared to the error detecting code appended to the first cell. If no match is found, this indicates an error, and the destination node can request retransmission of this first packet. If a match is found, this indicates no errors and the first error detecting code (e.g., CRC checksum) is stored at the destination node as the "previous error detecting code", block 605.

At block 610, the destination node detects if there are more cells. If no more cells are received, the process stops, block 615. Otherwise, the next cell is received with the next error detecting code (e.g., CRC checksum) appended to the next cell, block 620. The next error detecting code is then copied and stored in local memory at the destination node, block 625. At block 630, the next error detecting code appended to the next cell (that was just received at block 620) is replaced with the previous error detecting code.

At block 635, a test error detecting code (e.g., a test CRC checksum) is calculated as a function of at least a portion of the next cell and the previous error detecting code appended thereto. At block 640, the destination node compares the test error detecting code to the next error detecting code stored in memory at the destination node (stored at step 625). If there is no match, this indicates an error, block 645, and the destination may request retransmission of the cell. However, because the error could be due to one or more lost cells, the destination node may preferably request retransmission of the entire packet because it may be unclear which cell could be missing or lost. If a match is found between the test error detecting code and the next error detecting code, then there is no error, block 650, and the next error detecting code is now stored as the "previous error detecting code" (in preparation for the next iteration through the loop of FIG. 6), block 655. The process then continues back to block 610 to examine the cumulative error detecting code for the next cell in the same manner. In this manner a cumulative error detecting code is provided that allows detecting of errors in each individual cell as well detection of a group of cells of a packet (e.g., missing or dropped cells).

Therefore, it can be seen that the error detecting code according to an embodiment of the present invention is calculated as a function of the current cell and the previous error detecting code (i.e., as a function both of the current cell and previous cells in the packet). As a result, the current error detecting code may be used to detect errors in the current cell as well as missing cells (e.g., cells which may be lost or dropped in transit over the network to the destination node). Therefore the present invention provides an improved error detection technique.

In addition, the use of a cumulative error detecting code according to an embodiment of the present invention may also provide additional security over use of a conventional error detecting code. A unauthorized recipient of a cell or cells who is unaware of the usage of a cumulative error detecting code as described herein may incorrectly calculate the CRC checksum or error detecting code in a conventional manner over each individual cell only. As a result, when no match is found, the recipient may erroneously assume that the cell or packet is corrupted and discard the packet.

Several embodiments of the present invention are specifically illustrated and/or described herein. However, it will be appreciated that modifications and variations of the present invention are covered by the above teachings and within the purview of the appended claims without departing from the spirit and intended scope of the invention. As used herein, the term "cell" is used to mean a collection of data that is transmitted as a single unit, and is not limited to an Asynchronous Transfer Mode (ATM) cell or the like. Rather the term "cell" encompasses any type of data unit, such as a packet, datagram, cell, etc.

What is claimed is:

1. A method of transmitting cells comprising:

calculating a next error detecting code as a function of at least a portion of a next cell to be transmitted and an error detecting code of a previous cell appended to the next cell;

replacing the error detecting code of the previous cell appended to the next cell with the next error detecting code; and transmitting the next cell including the next error detecting code appended thereto.

2. The method of claim 1 wherein the step of calculating a next error detecting code comprises the step of calculating a cyclic redundancy check (CRC) checksum as a function of at least a portion of a next cell to be transmitted and a CRC checksum of a previous cell appended to the next cell.

3. The method of claim 1 where in the step of calculating a next error detecting code comprises calculating a next error detecting code as a function of at least a portion of a next cell to be transmitted and an error detecting code of a previous cell appended to the next cell, both the next cell and the previous cell comprising a header and a cell payload.

4. The method of claim 3 wherein the cell payload comprises data.

5. The method of claim 3 wherein the cell header comprises a source address and a destination address.

6. The method of claim 3 wherein the cell header comprises a source address, a destination address, a packet sequence number and a cell sequence number.

7. The method of claim 1 and further comprising the steps of:

receiving a packet to be transmitted;

segmenting the packet into a plurality of the cells to be transmitted, each cell of the packet including an associated cell sequence number in the cell header.

8. A method of transmitting cells comprising:

calculating a CRC checksum as a function of at least a portion of a next cell to be transmitted and a CRC checksum of a previous cell appended to the next cell;

replacing the CRC checksum of the previous cell appended to the next cell with the next CRC checksum; and transmitting the next cell including the next CRC checksum appended thereto.

9. A method of transmitting cells comprising:

storing an error detecting code of a previous cell;

receiving the next cell to be transmitted;

appending the error detecting code of the previous cell to the next cell;

calculating a next error detecting code as a function of at least a portion of the next cell to be transmitted and the error detecting code of the previous cell appended thereto;

replacing the error detecting code of the previous cell appended to the next cell with the next error detecting code; and transmitting the next cell including the next error detecting code appended thereto.

10. A method of transmitting cells comprising:

calculating at a source node a first error detecting code as a function of at least a portion of a first cell to be transmitted;

appending the first error detecting cell to the first cell as a trailer thereto;

storing the first error detecting code at the source node;

transmitting the first cell including the first error detecting code appended thereto from the source node;

calculating a second error detecting code at the source node as a function of at least a portion of a second cell with the first error detecting code appended thereto;

storing the second error detecting code at the source;

replacing the first error detecting code with the second error detecting code as the trailer for the second cell; and transmitting the second cell including the second error detecting code appended thereto from the source node.

11. A method of receiving cells comprising:

storing a previous error detecting code;

receiving a next cell including a next error detecting code appended thereto;

storing the next error detecting code;

replacing the next error detecting code appended to the next cell with the previous error detecting code;

calculating a test error detecting code as a function of the next cell and the previous error detecting code appended thereto; and comparing the test error detecting code with the next error detecting code to determine if there is an error in the received next cell.

12. The method of claim 11 wherein the next cell includes a header, a cell payload and the error detecting code.

13. The method of claim 12 wherein said error detecting code is a cumulative error detecting code.

14. A method of receiving cells comprising:

storing a previous CRC checksum;

receiving a next cell including a next CRC checksum appended thereto;

storing the next CRC checksum;

replacing the next CRC checksum appended to the next cell with the previous CRC checksum;

calculating a test CRC checksum as a function of the next cell and the previous CRC checksum appended thereto; and comparing the test CRC checksum with the next CRC checksum to determine if there is an error in the received next cell.

15. A computer program encoded on a computer readable medium for transmitting a cell, the computer program causing the following to be performed when executed by a computer:

calculating a next error detecting code as a function of at least a portion of a next cell to be transmitted and an error detecting code of a previous cell appended to the next cell;

replacing the error detecting code of the previous cell appended to the next cell with the next error detecting code; and transmitting the next cell including the next error detecting code appended thereto.

16. A computer program encoded on a computer readable medium for receiving a cell, the computer program causing the following to be performed when executed by a computer:

storing a previous error detecting code;

receiving a next cell including a next error detecting code appended thereto;

storing the next error detecting code;

replacing the next error detecting code appended to the next cell with the previous error detecting code;

calculating a test error detecting code as a function of the next cell and the previous error detecting code appended thereto; and comparing the test error detecting code with the next error detecting code to determine if there is an error in the received next cell.

* * * * *